United States Patent
Okada

[11] Patent Number: 6,146,989
[45] Date of Patent: Nov. 14, 2000

[54] METHOD OF FABRICATING SEMICONDUCTOR DEVICE WITH CAVITY INTERPOSED BETWEEN WIRINGS

[75] Inventor: Norio Okada, Tokyo, Japan

[73] Assignee: NEC Corporation, Tokyo, Japan

[21] Appl. No.: 08/975,046

[22] Filed: Nov. 20, 1997

[30] Foreign Application Priority Data

Nov. 20, 1996 [JP] Japan .................................... 8-309282

[51] Int. Cl.[7] .............................................. H01L 21/4763
[52] U.S. Cl. .......................... 438/622; 438/620; 438/624; 438/625; 438/631; 438/638
[58] Field of Search .................... 438/620, 624, 438/631, 625, 638, 673, 699, 514, 570, 597, 696, 703, 622

[56] References Cited

U.S. PATENT DOCUMENTS

| | | | |
|---|---|---|---|
| 4,667,395 | 5/1987 | Ahigren et al. | 29/591 |
| 5,569,618 | 10/1996 | Matsubara | 438/699 |
| 5,578,522 | 11/1996 | Nakamura et al. | 438/589 |
| 5,712,140 | 1/1998 | Ishii et al. | 438/625 |

FOREIGN PATENT DOCUMENTS

| | | |
|---|---|---|
| 62-5643 | 1/1987 | Japan . |
| 3-196662 | 8/1991 | Japan . |
| 7-114236 | 12/1995 | Japan . |

*Primary Examiner*—David Nelms
*Assistant Examiner*—Reneé R. Berry
*Attorney, Agent, or Firm*—Young & Thompson

[57] ABSTRACT

A wiring layer is formed on a first interlayer insulation film. An oxide film is formed on the wiring layer. The oxide film is patterned to have a gap corresponding to a gap between wirings. Thereafter, the wiring layer and a surface layer of the first interlayer insulation film are etched using the oxide film remaining on the wiring layer as a mask. On this occasion, two wirings are formed by the wiring layer so as to be separated from each other by the gap. Subsequently, a second interlayer insulation film is formed on the wirings and in the gap between the wirings with a cavity remaining in the gap by means of a bias ECR film deposition method.

14 Claims, 4 Drawing Sheets

METHOD OF FABRICATING SEMICONDUCTOR DEVICE WITH CAVITY INTERPOSED BETWEEN WIRINGS

BACKGROUND OF THE INVENTION

1. Field of the Invention

The present invention relates to a method of fabricating a semiconductor device with a cavity interposed between wirings formed on the same layer.

2. Description of the Related Art

There have arisen a problem of a wiring delay together with progress in miniaturization of a semiconductor device. As for causes of the wiring delay, there are a resistance of wiring and capacitance between wirings. In order to reduce a resistance of a wiring, adopting a suitable material for a wiring and thickening a film for wiring are considered. However, thickening of a film for wiring would be like swimming against the current of miniaturization of the semiconductor device, and a capacitance between wirings comes to increase as well. Accordingly, it is desired a method for reducing a capacitance between wirings, especially, formed on the same layer, while securing reliability of the wiring. Methods are under examination in which a dielectric constant of an insulation film between wirings is lowered by use of an oxide film mixed with fluorine or an organic interlayer film as the insulation film between the wirings. However, as a distance between wirings becomes narrower, an insulation film with a lower dielectric constant is more in demand.

Methods of fabricating a semiconductor device containing an insulation film as a layer in which a cavity is interposed between wirings formed on the same layer have been proposed (Japanese Examined Patent Publication (Kokoku) No. Hei 7-114236 and Japanese Unexamined Patent Publication (Kokai) No. Sho 62-5643). FIG. 1 is a sectional view showing a method of fabricating a semiconductor device disclosed in the Japanese Examined Patent Publication No. Hei 7-114236. In a conventional method of fabricating a semiconductor device described in this publication, first, a first insulation film 16 is formed on a semiconductor substrate 15. Subsequently, two wirings 17 are formed on the first insulation film 16 separated from each other by patterning. Furthermore, a second insulation film 18 is formed on and between the wirings 17 by means of a sputtering method. On this occasion, a cavity 19 is formed in the second insulation film 18 between the wirings 17. In the semiconductor device fabricated as mentioned above, since the cavity 19 has a lower dielectric constant than that of the second insulation film 18, a capacitance between the wirings 17 is reduced to a lower value, compared with the case where a cavity 19 is not formed. In the above mentioned semiconductor device, however, an area where a cavity is not formed between wirings 17 remains and thereby a capacitance in the area is still not reduced. Therefor, the capacitance between wirings 17 is not reduced enough.

On the other hand, in a conventional method of fabrication a semiconductor device disclosed in the Japanese Unexamined Patent Publication No. Sho 62-5643, wirings are first formed on an insulation film. On formation of the wirings, an insulation film between the wirings is over-etched. An interlayer insulation film is formed between the wirings formed on the same insulation film by means of a common CVD method, and, at the same time, a cavity is formed in the interlayer insulation film. In the semiconductor device fabricated as mentioned above, since the interlayer insulation film containing the cavity which works as a perfect shield between the wirings is formed, the capacitance between the wirings is more reduced, compared with the semiconductor device described in the Japanese Examined Patent Publication No. Hei 7-114236. However, locations and sizes of cavities are hard to control by means of the common CVD method. For example, in the case where an interlayer insulation film lying on the lower side of aluminum wirings is over-etched to a great extent, an aspect ratio of a space between the wirings becomes larger in excess and thereby a cavity to work as a perfect shield between the wirings can not be formed in some cases. Accordingly, reduction of capacitance is not enough. In a method in which etching of an insulation film is effected taking a resist film as a mask, since a selectivity between the insulation film and the resist film is not enough, the upper end corners of aluminum wirings are etched off during etching the insulation film.

A method is proposed in which a cavity is formed between first wirings on the same layer taking a second wiring as a mask which is formed above the first wirings (Japanese Unexamined Patent Publication (Kokai) No. Hei 3-196662). FIG. 2A is a plan view showing a method of fabricating a semiconductor device disclosed in the Japanese Unexamined Patent Publication No. Hei 3-196662. FIG. 2B is a sectional view taken along the A—A in FIG. 2A and FIG. 2C is a sectional view taken along the B—B in FIG. 2A. In a conventional method of fabricating a semiconductor device disclosed in the publication, two lower wirings 21 are first formed on a flat insulation film 25 in parallel. An interlayer insulation film 22 is then formed all over the exposed surface. An upper wiring 20 located in a perpendicular relation to the lower wirings 21 is formed on the interlayer insulation film 22. Thereafter, the interlayer insulation film 22 is etched by means of a RIE method taking the upper wiring 20 and the lower wirings 21 as a mask. As a result, as shown in FIG. 2B, the interlayer insulation film 22 under the upper wiring 20 is not etched, but as shown in FIG. 2C, the insulation film 25 is partly over-etched. Subsequently, a surface protecting film 24 is formed all over the exposed surface. The surface protecting film 24 is omitted in FIG. 2A. In a semiconductor device fabricated in such a manner, since a cavity 23 is interposed between the lower wirings 21 except an area under the upper wiring 20, a capacitance between the lower wirings 21 is reduced.

A size, location and the like of the cavity 23, however, are dependent on a layout of the upper wiring 20 and therefore no cavity is formed under the upper wiring 20. For this reason, the capacitance between the lower layer wirings 21 becomes uneven and thus the overall reduction of capacitance is not enough. Moreover, unless an etching condition with an enough selectivity is selected when the interlayer insulation film 22 is etched, the lower wirings 21 are partly etched and, as a result, there arises a problem that the lower wirings 21 are narrower and have a higher resistance than desired.

SUMMARY OF THE INVENTION

The present invention has an object to provide a method of fabricating a semiconductor with a cavity interposed between wirings which make a capacitance between the wirings on the same layer reduced without making the wirings narrower.

A method of fabricating a semiconductor device with a cavity interposed between wirings according to the present invention comprises the steps of: forming a wiring layer on a first interlayer insulation film; forming an oxide film on the wiring layer; patterning the oxide film so as to have a gap corresponding to a gap between wirings; etching the wiring layer and a surface layer of the first interlayer insulation film taking the oxide film as a mask. In the step of etching the wiring layer and the surface layer of the first interlayer insulation film, two wirings are formed by the wiring layer so as to be separated from each other by the gap. Furthermore, a second interlayer insulation film is formed on the wirings leaving the gap with a cavity, therein.

According to the present invention, since the wiring layer and the surface layer of the interlayer insulation film are etched taking the oxide film as a mask, the selectivity in etching is higher, compared with conventional use of a resist film as a mask. For this reason, narrowing the wiring is prevented and at the same time a gap interposed between the wirings with a desired aspect ratio can be formed easily. Thereby, since a gap which works as a perfect shield between wirings is formed, the capacitance between the wirings are dramatically reduced.

DETAILED DESCRIPTION OF THE PREFERRED EMBODIMENTS

Figure 1:
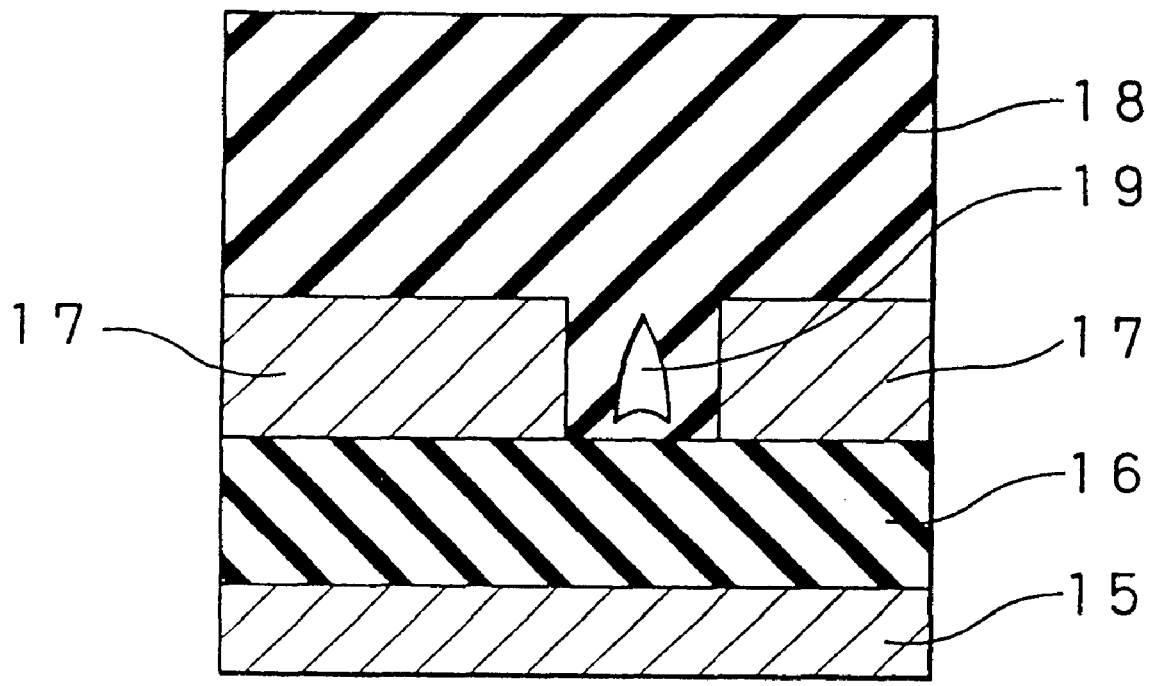
FIG. 1 is a sectional view showing a method of fabricating a semiconductor device disclosed in the Japanese Examined Patent Publication No. Hei 7-114236.
Figure 2A:
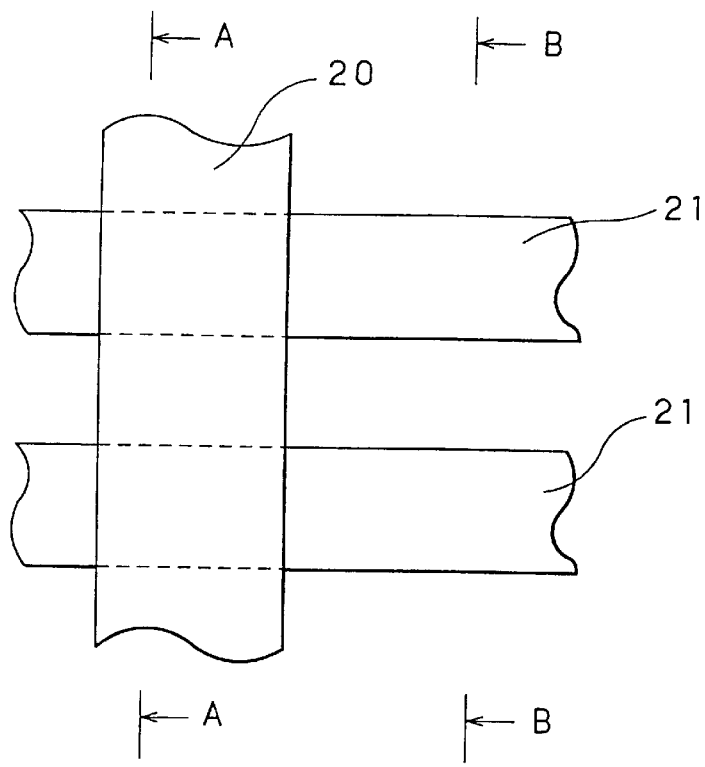
FIG. 2A is a plan view showing a method of fabricating a semiconductor device disclosed in the Japanese Unexamined Patent Publication No. Hei 3-196662.
Figure 2B:
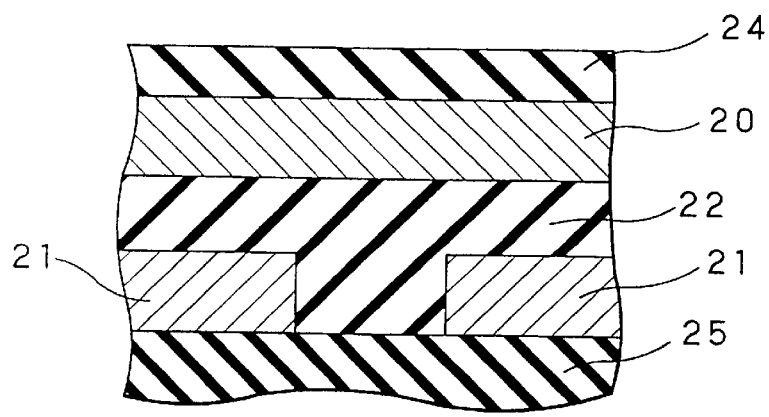
FIG. 2B is a sectional view taken along the A—A in FIG. 2A.
Figure 2C:
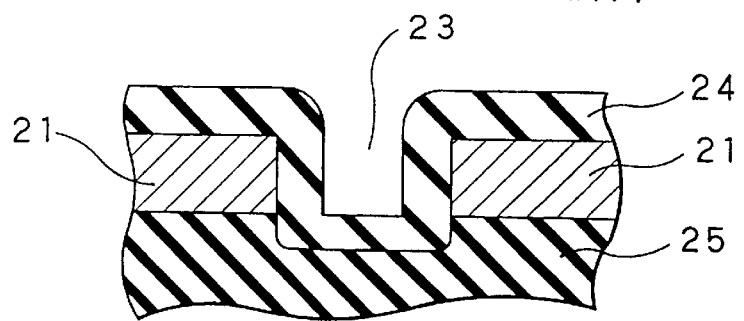
FIG. 2C is a sectional view taken along the B—B in FIG. 2A.
Figure 3A:
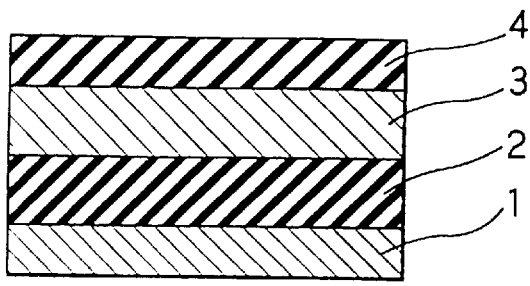
FIGS. 3A to 3E are sectional views showing steps in a method of fabricating a semiconductor device according to a first embodiment of the present invention.

The present invention will be in a concrete manner described with a reference to the accompanying drawings. FIGS. 3A to 3E are sectional views showing steps in a method of fabricating a semiconductor device according to the first embodiment of the present invention. In the first embodiment of the present invention, as shown in FIG. 3A, a first interlayer insulation film 2 is first formed on a semiconductor substrate 1 having functional devices. A wiring layer 3 is formed by means of a sputtering method on the first interlayer insulation film 2. The wiring layer 3 is, for example, a composite film in a multi-layered structure constructed from a TiN film with a thickness of 500 Å, a first Ti film with a thickness of 250 Å deposited on the TiN film, an AlCu film with a thickness of 4500 Å deposited on the first Ti film, and a second Ti film with a thickness of 250 Å deposited on the AlCu film. Thereafter, an oxide film 4 the etching rate which is lower than or equal to that of the first interlayer insulation film 2 is formed on the wiring layer 3 to a thickness of, for example, 500 Å.

Figure 3B:
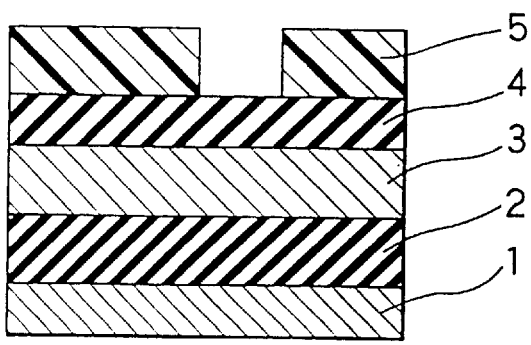

Thereafter, as shown in FIG. 3B, photoresist 5 is coated on the oxide film 4. The photoresist 5 is subjected to exposure and development to have a gap corresponding to a gap between wirings on the first interlayer insulation film 2.

Figure 3C:
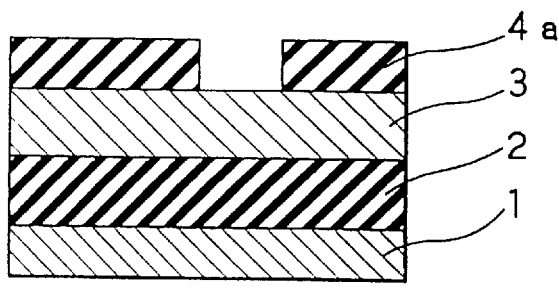

The oxide film 4 is, as shown in FIG. 3C, patterned taking the patterned photoresist 5 as a mask to have a gap corresponding to the gap between the wirings. Subsequently, the photoresist 5 is removed. On this occasion, on the wiring layer 3 remains an oxide film 4a having a shape of the mask pattern for use when the wiring layer 3 is etched.

Figure 3D:
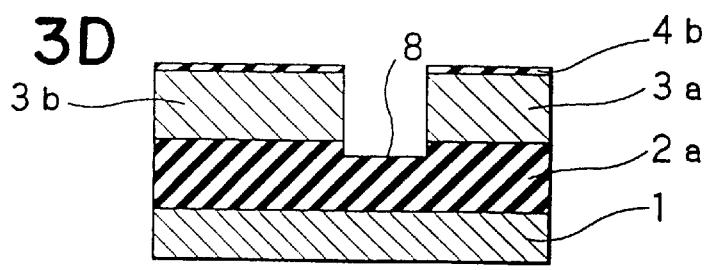

The wiring layer 3 is etched using the oxide film 4a as a mask, as shown in FIG. 3D. Thereby, the wiring layer 3 is divided and transformed into wirings 3a and 3b, while a gap 8 is formed between the wirings 3a and 3b. The surface layer of the first interlayer insulation film 2 is etched till an aspect ratio of the gap 8 reaches a desired value, so that an interlayer insulation film 2a with a recess is formed. Thus, a depth of the gap 8 is larger than a thickness of the wirings 3a and 3b, so that the gap 8 with the desired aspect ratio is formed. On this occasion, since the etching rate of the oxide layer 4a is lower than that of the first interlayer insulation film 2, the oxide film 4a is etched to the same length or smaller than a length the first interlayer insulation film 2, so that an oxide film 4b thinner than the oxide film 4a is formed.

Figure 3E:
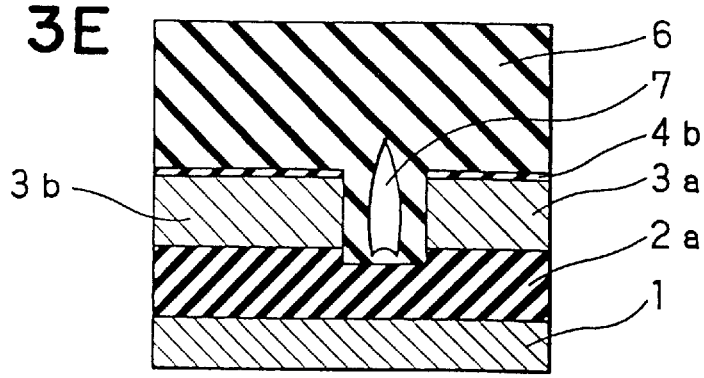

In the following step, as shown in FIG. 3E, a second interlayer insulation film 6 is formed in the gap 8 and on the oxide film 4b by means of a bias ECR film deposition method, for example, under conditions that feed velocities of $SiH_4$ gas, $O_2$ gas and Ar gas are 40 sccm, 60 sccm and 70 sccm respectively. On this occasion, in the second interlayer insulation film 6 in the gap 8, a cavity 7 is formed which extends from a position lower than a level corresponding to the lower surface of the wirings 3a and 3b to a position higher than a level corresponding to the upper surface of the wirings 3a and 3b. In such a manner, a second interlayer insulation film 6 having the cavity 7 is formed between the wirings 3a and 3b on the same first interlayer insulation film 2a, so that a semiconductor device is completed.

In a semiconductor device thus fabricated, since a dielectric constant of the cavity 7 is lower than that of the second interlayer insulation film 6, a capacitance between the wirings 3a and 3b is extremely low, compared with the case where the second interlayer insulation film 6 has no cavity. For this reason, a wiring delay is reduced.

In the embodiment, a time period during which the first interlayer insulation film 2 is etched is adjusted and thereby a gap which extends upward from a position lower than the level corresponding to the lower surface of the wirings 3a and 3b can be formed for certain. Therefore, a semiconductor device in which a capacitance between wirings on the same layer is extremely low can be sure to be fabricated.

Moreover, since the wiring layer 3 and the first interlayer insulation film 2 are etched taking the oxide film 4a as a mask, a selectivity in etching is higher, compared with the case where a resist film is taken as a mask according to a conventional manner. Therefore, a gap with a desired aspect ratio can be easily formed.

Since the second interlayer insulation film 6 is formed by means of the bias ECR film deposition method, a size, location and the like of the cavity 7 can be controlled with a great ease, compared with the case where the CVD method is used.

In the case where the surface of the second interlayer insulation film 6 is made planar by chemico-mechanical polishing (CMP), it can be prevented that the upper portion of the cavity 7 is exposed to the air at the surface after the polishing by controlling an etching amount of the first interlayer insulation film 2 without modification of conditions for film deposition of the second interlayer insulation film 6.

In the embodiment, while the photoresist 5 is removed after the oxide film 4a is formed, the wiring layer 3 may be etched without removal of the photoresist 5.

Figure 4A:
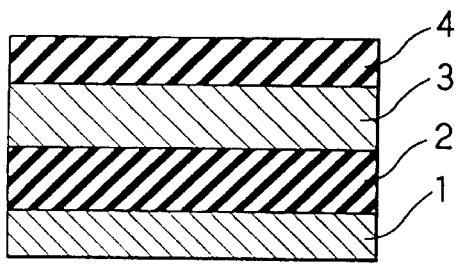
FIGS. 4A to 4F are sectional views showing steps in a method of fabricating a semiconductor device according to a second embodiment of the present invention.

Next, the second embodiment of the present invention will be described. FIGS. 4A to 4F are sectional views showing steps of a method of fabricating a semiconductor according to the second embodiment of the present invention. In the embodiment shown in FIGS. 4A to 4F, the same region as that of a region of the first embodiment is designated at the same reference mark as that of the region of the first embodiment and detailed description of the region is omitted. In the second embodiment of the present invention, a first interlayer insulation film 2 is first formed on a semiconductor substrate 1 having functional devices formed, as shown in FIG. 4A. A wiring layer 3 is formed on the first interlayer insulation film 2 by means of a sputtering method. The wiring layer 3 is, for example, a composite film in a multi-layered structure constructed from a TiN film with a thickness of 500 Å, a first Ti film with a thickness of 250 Å deposited on the TiN film, an AlCu film with a thickness of 4500 Å deposited on the first Ti film, and a second Ti film with a thickness of 250 Å deposited on the AlCu film. Thereafter, an oxide film 4 the etching rate of which is lower than or equal to that of the first interlayer insulation film 2 is formed on the wiring layer 3 to a thickness of, for example, 500 Å.

Figure 4D:
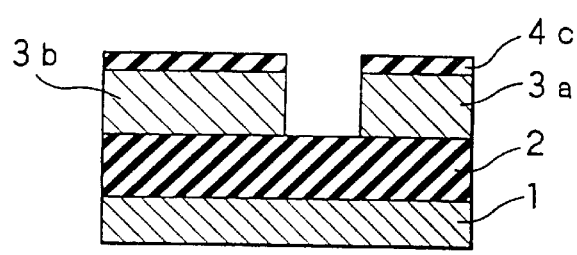
Figure 4B:
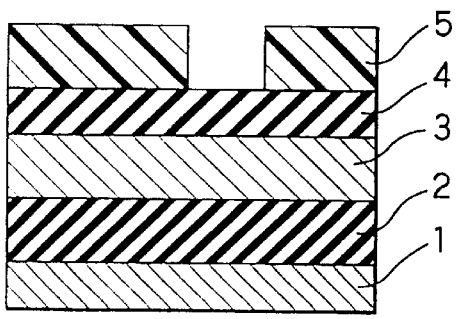

Thereafter, as shown in FIG. 4B, photoresist 5 is coated on the oxide film. The photoresist 5 is subjected to exposure and development to have a gap corresponding to a gap between wirings on the first interlayer insulation film 2.

Figure 4E:
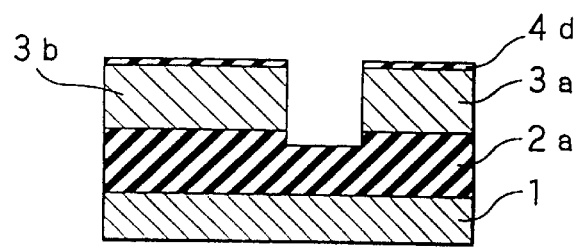
Figure 4C:
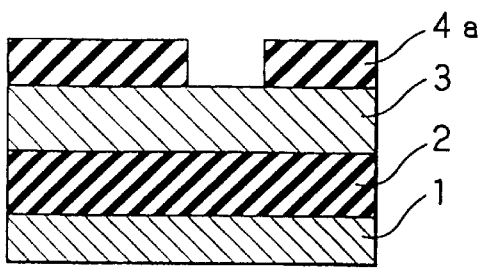

The oxide film 4 is, as shown in FIG. 4C, patterned taking the patterned photoresist 5 as a mask to have a gap corresponding to the gap between the wirings. Subsequently, the photoresist 5 is removed. On this occasion, on the wiring layer 3 remains an oxide film 4a having a shape of the mask pattern for use when the wiring layer 3 is etched.

As shown in FIG. 4D, the wiring layer 3 is etched by, for example, $Cl_2$ gas, $BCl_3$ gas and $CHF_3$ gas with the oxide film 4a as a mask. Thereby, the wiring film 3 is divided and transformed into wirings 3a and 3b. A gap is formed between the wirings 3a and 3b. On this occasion, the oxide film 4a, too, is etched to form an oxide film 4c thinner than the oxide film 4a.

Subsequently, as shown in FIG. 4E, the surface layer of the first interlayer insulation film 2 is etched using the oxide film 4c as a mask by use of, for example, $CF_4$ gas, $CHF_3$ gas, Ar gas and He gas and as a result, a first interlayer insulation film 2a having a recess is formed. On this occasion, the oxide film 4c, too, is etched to form an oxide film 4d thinner than the oxide film 4c. Thus, a gap 8 with a desired aspect ratio is formed between the wirings 3a and 3b.

Figure 4F:
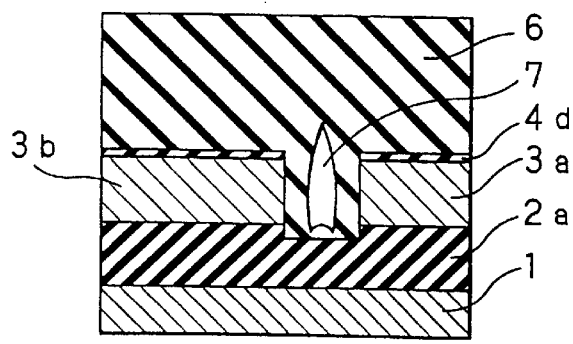

In the following step, as shown in FIG. 4F, a second interlayer insulation film 6 is formed in the gap 8 and on the oxide film 4b by means of a bias ECR film deposition method, for example, under conditions that feed velocities of $SiH_4$ gas, $O_2$ gas and Ar gas are 40 sccm, 60 sccm and 70 sccm respectively. On this occasion, as in the first embodiment, in the second interlayer insulation film 6 in the gap 8, a cavity 7 is formed which extends from a position lower than a level corresponding to the lower surface of the wirings 3a and 3b to a position higher than a level corresponding to the upper surface of the wirings 3a and 3b. In such a manner, a second interlayer insulation film 6 having the cavity 7 is formed between the wirings 3a and 3b on the same first interlayer insulation film 2a, so that a semiconductor device is completed.

In the embodiment, since a step of etching the wiring layer 3 and a step of etching the first interlayer insulation film 2 are individually performed, a proper gas is selected in each step and thereby an etching condition for each step can be adjusted to the most suited, so that productivity such as a throughput can be improved.

Moreover, since the first interlayer insulation film 2 is etched taking the oxide film 4c as a mask, an etching amount of the first interlayer insulation film 2 can be controlled with ease, for example, by adjustment of a time length of etching. As a result, since a gap with a desired aspect ratio can easily be formed, a semiconductor device with an extremely low capacitance between wirings on the same layer can be fabricated for certain.

In the case where the surface of the second interlayer insulation film 6 is made planar by chemico-mechanical polishing (CMP), it can be prevented that the upper portion of the cavity 7 is exposed to the air at the surface after the polishing by controlling an etching amount of the first interlayer insulation film 2 without modification of conditions for film deposition of the second interlayer insulation film 6.

In the embodiment, while the photoresist 5 is removed after the oxide film 4a is formed, the wiring layer 3 may be etched without removal of the photoresist 5.

In the first and second embodiments, nitrogen may be contained in the oxide film 4 used as a mask in etching of the wiring layer 3. In the case where nitrogen is contained, a selectivity between the oxide film 4 and first interlayer insulation film 2 becomes higher. Fluorine may be also contained in the oxide film. Since a dielectric constant of the oxide film 4 containing fluorine is lower than that without fluorine, capacitances not only between the wirings 3a and 3b at the same level but between the wirings 3a and 3b, and wirings at an upper level thereof are reduced when the oxide film 4 containing fluorine is provided between the wirings 3a and 3b and between the wirings 3a and 3b, and the second interlayer insulation film 6.

What is claimed is:

1. A method of fabricating a semiconductor device with a cavity interposed between wirings comprising the steps of:
    forming a wiring layer on a first interlayer insulation film;
    forming an oxide film on said wiring layer;
    patterning said oxide film so as to have a gap corresponding to a gap between wirings;
    etching said wiring layer and a surface layer of said first interlayer insulation film using said oxide film as a mask, whereby two wirings are formed by said wiring layer so as to be separated from each other by said gap; and
    forming a second interlayer insulation film on said wirings and in said gap, leaving a cavity in said gap.

2. A method of fabricating a semiconductor device with a cavity interposed between wirings according to claim 1, wherein
    said cavity extends from a position lower than a level corresponding to the lower surface of said wirings to a position higher than a level corresponding to the upper surface of said wirings.

3. A method of fabricating a semiconductor device with a cavity interposed between wirings according to claim 1, wherein
    said oxide film contains nitrogen.

4. A method of fabricating a semiconductor device with a cavity interposed between wirings according to claim 1, wherein
    said oxide film contains fluorine.

5. A method of fabricating a semiconductor device with a cavity interposed between wirings according to claim 1, wherein said wiring layer comprises a composite film constructed from a TiN film, a first Ti film formed on said TiN film, an AlCu film formed on said first Ti film, and a second Ti film formed on said AlCu film.

6. A method of fabricating a semiconductor device with a cavity interposed between wirings according to claim 1, wherein the step of forming said second interlayer insulation film comprises a step of forming said second interlayer insulation film by means of a bias ECR film deposition method.

7. A method of fabricating a semiconductor device with a cavity interposed between wirings according to claim 6, wherein the step of forming said second interlayer insulation film by means of the bias ECR film deposition method comprises a step of forming said second interlayer insulation film with feed of $SiH_4$ gas, $O_2$ gas and Ar gas by means of the film deposition method.

8. A method of fabricating a semiconductor device with a cavity interposed between wirings according to claim 1, wherein the step of etching said wiring layer and the surface layer of said first interlayer insulation film comprises a step of etching said wiring layer using $Cl_2$ gas, $BCl_3$ gas and $CHF_3$ gas.

9. A method of fabricating a semiconductor device with a cavity interposed between wirings according to claim 1, wherein the step of etching said wiring layer and the surface layer of said first interlayer insulation film comprises a step of etching the surface layer of said first interlayer insulation film using $CF_4$ gas, $CHF_3$ gas, Ar gas and He gas.

10. A method of fabricating a semiconductor device with a cavity interposed between wirings according to claim 1, wherein the step of forming said wiring layer comprises a step of depositing said wiring layer by a sputtering method.

11. A method of fabricating a semiconductor device with a cavity interposed between wirings according to claim 1, which further comprising the steps of, between the steps of forming said oxide film and patterning said oxide film:

forming photoresist on said oxide film; and patterning said photoresist so as to have a gap corresponding to said gap.

12. A method of fabricating a semiconductor device with a cavity interposed between wirings according to claim 5, wherein said TiN film has a thickness of 500 Å, said first Ti film has a thickness of 250 Å, said AlCu film has a thickness of 4500 Å, and said second Ti film has a thickness of 250 Å.

13. A method of fabricating a semiconductor device with a cavity interposed between wirings according to claim 7, wherein the feed velocity of said $SiH_4$ gas is 40 sccm, the feed velocity of said $O_2$ gas is 60 sccm and the feed velocity of said Ar gas is 70 sccm.

14. A method of making a semiconductor device having a low capacitance between wires on the same level, comprising the steps of:

forming a wiring layer directly on a first level of a first insulation layer;

forming an oxide film directly on the wiring layer;

patterning the oxide film to provide an opening corresponding to a gap that is to be formed in the wiring layer;

etching the wiring layer and a surface of the insulation layer using the oxide film as a mask, forming two wire sections separated by the gap and removing a portion of the first insulation layer beneath the first level and between the two wire sections; and using a bias ECR film deposition method to form a second insulation layer on the oxide film and in the gap, leaving a cavity in the second insulation film in the gap between the wire sections, the cavity extending beneath the first level of the first insulation layer and above a top surface of the wiring layer.

* * * * *